United States Patent
Barwicz et al.

(10) Patent No.: US 8,546,269 B2
(45) Date of Patent: Oct. 1, 2013

(54) TOP-DOWN NANOWIRE THINNING PROCESSES

(75) Inventors: Tymon Barwicz, Mount Kisco, NY (US); Guy Cohen, Mohegan Lake, NY (US); Lidija Sekaric, Mount Kisco, NY (US); Jeffrey Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 443 days.

(21) Appl. No.: 12/417,936

(22) Filed: Apr. 3, 2009

(65) Prior Publication Data
US 2010/0255680 A1     Oct. 7, 2010

(51) Int. Cl.
*H01L 21/302* (2006.01)
*H01L 21/461* (2006.01)
*H01L 29/06* (2006.01)

(52) U.S. Cl.
USPC ..... 438/718; 438/698; 977/762; 257/E21.215

(58) Field of Classification Search
USPC .................. 438/718, 689; 257/E21.215
See application file for complete search history.

(56) References Cited

U.S. PATENT DOCUMENTS

| | | | |
|---|---|---|---|
| 6,855,606 B2 * | 2/2005 | Chen et al. | 438/283 |
| 7,083,104 B1 | 8/2006 | Empedocles et al. | |
| 7,262,501 B2 | 8/2007 | Duan et al. | |
| 2005/0275010 A1 * | 12/2005 | Chen et al. | 257/315 |
| 2007/0004124 A1 | 1/2007 | Suk et al. | |
| 2007/0138705 A1 | 6/2007 | Mickelson et al. | |
| 2008/0014689 A1 * | 1/2008 | Cleavelin et al. | 438/197 |

OTHER PUBLICATIONS

Büttner, C. C. and M. Zacharias "Retarded oxidation of Si nanowires" Dec. 27, 2006 Applied Physics Letters, American Institute of Physics, 89, 263106-1-263106-3.*
Kawashima et al. "Synthesis of Si nanowires with a thermally oxidized shell and effects of the shell on transistor characteristics" Dec. 25, 2008 Thin Solid films, 517, 4520-4526.*
Krylyuk et al. "Rapid thermal oxidation of silicon nanowires" Feb. 11, 2009 Applied Physics Letters, American Institute of Physics, 94, 063113-1-063113-3.*
Lee et al. "Thermal annealing in hydrogen for 3-D profile transformation on silicon-on-insulator and sidewall roughness reduction" Journal of Microelectromechanical Systems, IEEE, 15(2), 338-343.*
Kedzierski et al. "Novel method for silicon quantum wire transistor fabrication" Sep. 10, 1999, J. Vac. Sci. Technol. B, American Vacuum Society, 17(6) 3244-3247.*

(Continued)

*Primary Examiner* — Allan Olsen
*Assistant Examiner* — Margaret D Klunk
(74) *Attorney, Agent, or Firm* — Vazken Alexanian; Michael J. Chang, LLC

(57) ABSTRACT

Techniques for fabricating nanowire-based devices are provided. In one aspect, a method for fabricating a semiconductor device is provided comprising the following steps. A wafer is provided having a silicon-on-insulator (SOI) layer over a buried oxide (BOX) layer. Nanowires and pads are etched into the SOI layer to form a ladder-like structure wherein the pads are attached at opposite ends of the nanowires. The BOX layer is undercut beneath the nanowires. The nanowires and pads are contacted with an oxidizing gas to oxidize the silicon in the nanowires and pads under conditions that produce a ratio of a silicon consumption rate by oxidation on the nanowires to a silicon consumption rate by oxidation on the pads of from about 0.75 to about 1.25. An aspect ratio of width to thickness among all of the nanowires may be unified prior to contacting the nanowires and pads with the oxidizing gas.

12 Claims, 15 Drawing Sheets

(56) References Cited

OTHER PUBLICATIONS

Shir et al. "Oxidation of silicon nanowires" May 10, 2006, J. Vac. Sci. Technol. B, American Vacuum Society, 24(3) 1333-1336.*

Usenkov et al., "Evaporation of Thin Oxide Layer from Si-(111) Surface (Simulation)," 9th International Workshop and Tutorials EDM 2008, Session I, Jul. 1-5, Erlagol, pp. 37-40 (2008).

M. Gotza et al., "Fabrication and Photoluminescence Investigation of Silicon Nanowires on Silicon-on-Insulator Material," Journal of Vacuum Science & Technology B (Microelectronics and Nanometer Structures, vol. 16, No. 2, pp. 582-588 (1998).

M. Gotza et al., "Natural Masking for Producing Sub-10-nm Silicon Nanowires," Microelectronic Engineering 27, pp. 129-132 (1995).

* cited by examiner

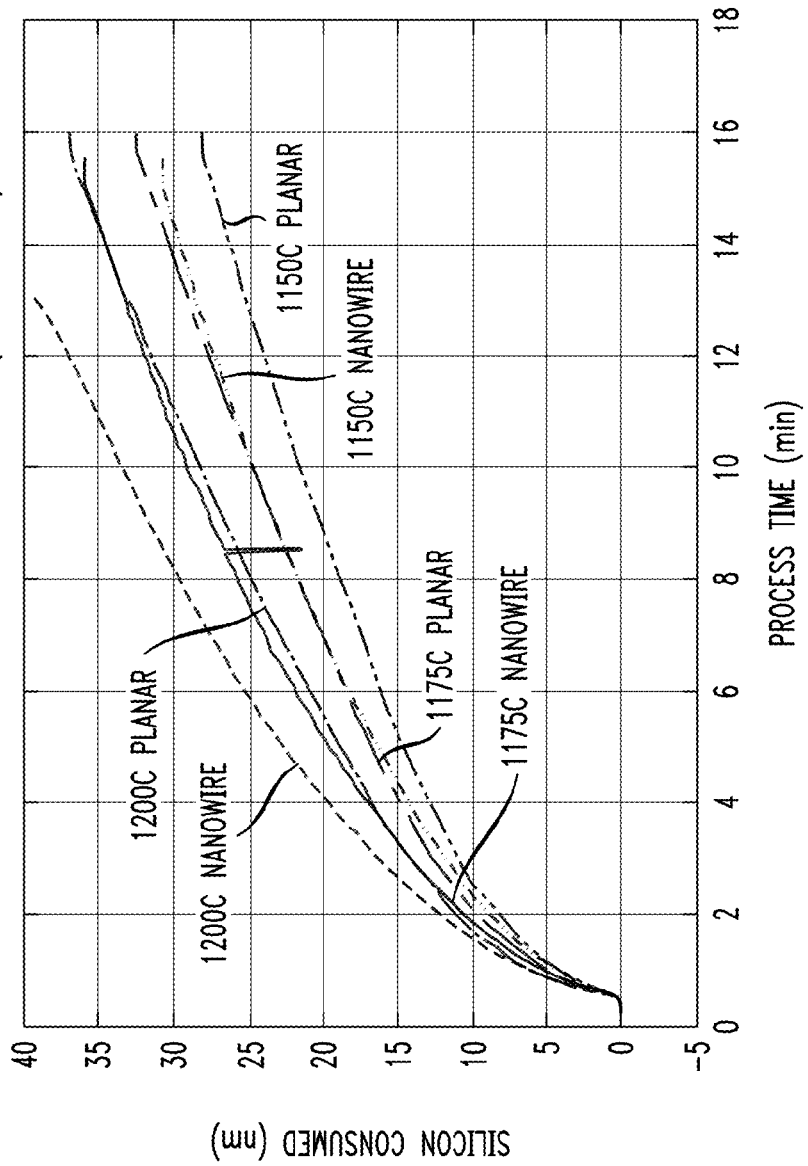

300

400

500A

500B

500C

500D $w_i$ = 106 nm    $w_i$ = 95 nm $w_i$ = 90 nm    $w_i$ = 86 nm $w_i$ = 75 nm    $w_i$ = 70 nm $w_i$ = 66 nm    $w_i$ = 62 nm $w_i$ = 59 nm

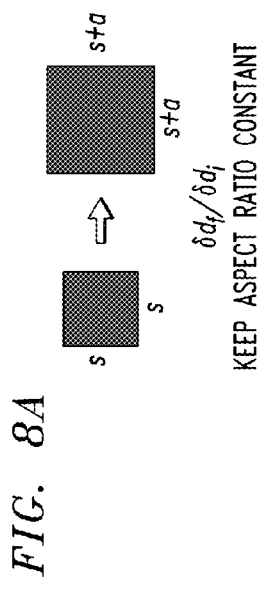
*FIG. 8A*
*FIG. 8B*
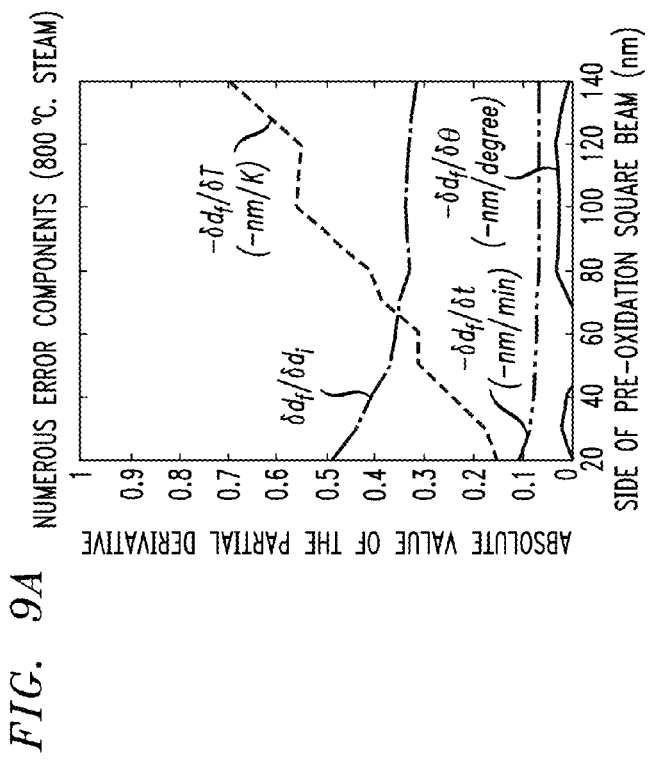
*FIG. 9A*
*FIG. 9B*

"DECORATING" NITRIDE LAYER

"DECORATING" NITRIDE LAYER

SUB-1 nm WIRE     ~1 nm WIRE

"DECORATING" NITRIDE LAYER

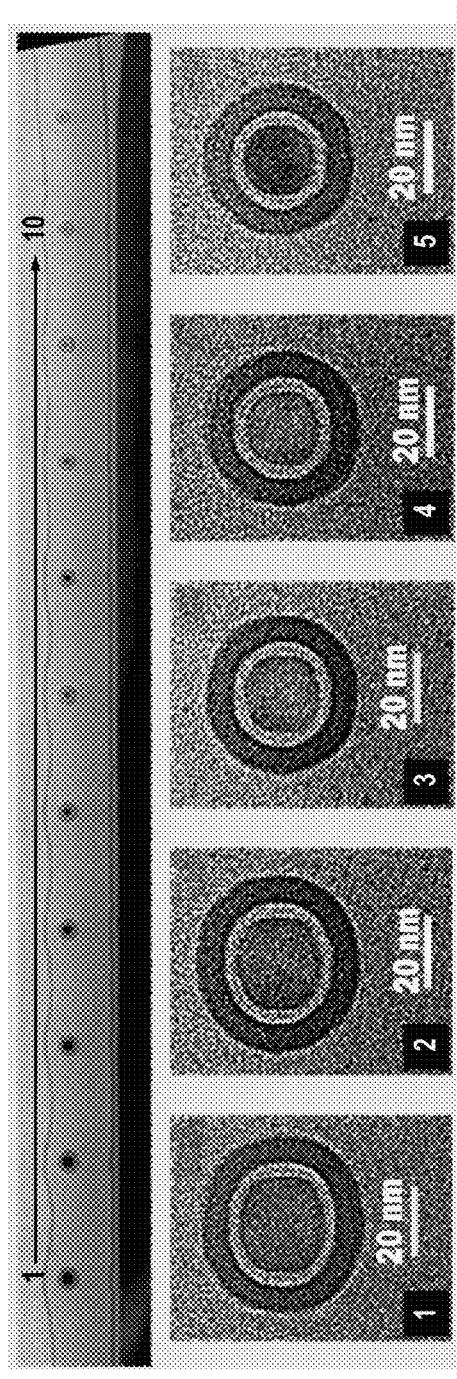
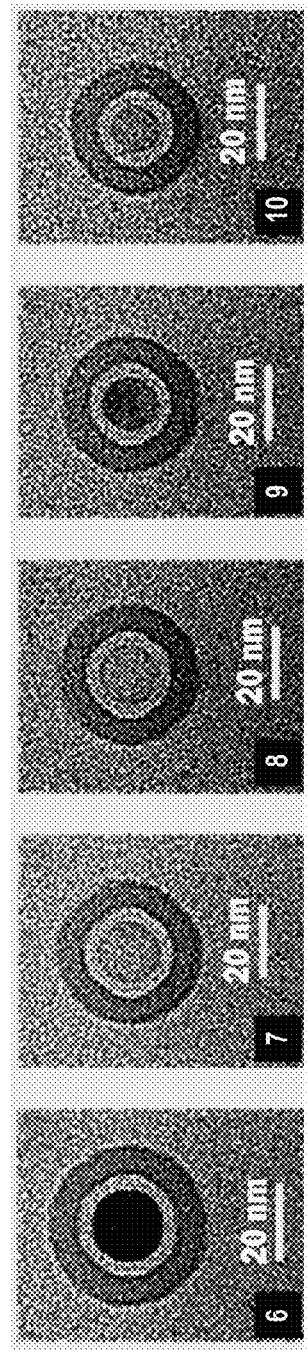
FIG. 12A FIG. 12B FIG. 12C FIG. 12D FIG. 12E
FIG. 12F FIG. 12G FIG. 12H FIG. 12I FIG. 12J

TOP-DOWN NANOWIRE THINNING PROCESSES

FIELD OF THE INVENTION

The present invention relates to nanowire technology, and more particularly, to techniques for fabricating nanowire-based devices.

BACKGROUND OF THE INVENTION

With their favorable physical properties, nanowires have many potential uses in nanoscale-device applications. In semiconductor devices for example, nanowires are commonly used as building blocks for the fabrication of photonics and/or electronic nano devices. Nanowires may also be used in semiconductor devices to form connections, such as channels between the various electrodes of a transistor. The use of silicon nanowires has the added advantage of being easily integrated into existing silicon-based device technology and having reproducible control of the nanowires' electronic properties.

A top-down fabrication process is often used to produce devices that use silicon nanowires. The top-down fabrication process is similar to that used in the fabrication of complementary metal-oxide-semiconductor (CMOS) devices, and generally includes lithographically defining the nanowires in a silicon-on-insulator (SOI) wafer. In one implementation, the device formed contains silicon nanowires that span a well. Various processing steps may then be carried out from the top of the device. One such step is the thinning of parts of the nanowires that span the well, e.g., for the purpose of forming ultra-thin channels.

The thinning of the nanowires may be achieved by oxidation. For example, a hardmask can be deposited over portions of the nanowires that are not to be thinned by the oxidation. The hardmask has an open portion, called a window, through which oxidation of the select parts of the nanowires can take place.

Masking for selective oxidation at small dimensions can be challenging, as stress effects at edges tend to enhance the oxidation rate and create excessively oxidized regions in the nanowire. These regions are highly resistive and limit final nanowire dimensions, as thinning can physically disconnect the nanowire.

Control over the nanowire dimensions, such as the final nanowire diameter and aspect ratio, is important since variations in the geometry of the nanowire can induce corresponding variations in the device properties. To minimize variation, accurate control of both the pre-thinned silicon thickness on the SOI wafer (well beyond the few nanometer accuracy currently available) and of the lithographically defined nanowire width is needed.

One approach that can be used to improve aspect ratio uniformity of a thinned nanowire involves adjusting the lithographic dose to correct the nanowire's defined width based on local material thickness mapped with an ellipsometer. However, this approach does not provide sufficient accuracy since it is limited by the accuracy of the thickness measurement and lithographic control on the nanowire width. Self-limiting thermal oxidation may be used to reduce final nanowire size variations, but these processes are sensitive to initial nanowire asymmetry.

Therefore, fabrication processes for nanowire devices that avoid the problems associated with masking for selective nanowire oxidation would be desirable as would processes that provide for accurate control over the final nanowire dimensions in such devices.

SUMMARY OF THE INVENTION

The present invention provides techniques for fabricating nanowire-based devices. In one aspect of the invention, a method for fabricating a semiconductor device is provided. The method comprises the following steps. A wafer is provided having a silicon-on-insulator (SOI) layer over a buried oxide (BOX) layer. Nanowires and pads are etched into the SOI layer to form a ladder-like structure wherein the pads are attached at opposite ends of the nanowires. The BOX layer is undercut beneath the nanowires. The nanowires and pads are contacted with an oxidizing gas to oxidize the silicon in the nanowires and pads under conditions that produce a ratio of a silicon consumption rate by oxidation on the nanowires to a silicon consumption rate by oxidation on the pads of from about 0.75 to about 1.25. The ratio of the silicon consumption rate by oxidation on the nanowires to the silicon consumption rate by oxidation on the pads can be from about 0.75 to about one. The ratio of the silicon consumption rate by oxidation on the nanowires to the silicon consumption rate by oxidation on the pads can be from about one to about 1.25. An aspect ratio of width to thickness among all of the nanowires may be unified prior to contacting the nanowires and pads with the oxidizing gas.

In another aspect of the invention, another method for fabricating a semiconductor device is provided. The method comprises the following steps. A wafer is provided having a SOI layer over a BOX layer. Nanowires and pads are etched into the SOI layer to form a ladder-like structure wherein the pads are attached at opposite ends of the nanowires. The BOX layer is undercut beneath the nanowires. An aspect ratio of width to thickness is unified among all of the nanowires. The nanowires are thinned.

A more complete understanding of the present invention, as well as further features and advantages of the present invention, will be obtained by reference to the following detailed description and drawings.

BRIEF DESCRIPTION OF THE DRAWINGS

FIG. 2 is a graph illustrating a calculated geometrical effect at rapid thermal oxidation using a computer simulation according to an embodiment of the present invention;

FIG. 8A is a diagram illustrating a cross-sectional area change of a nanowire without change in its asymmetry according to an embodiment of the present invention;

FIG. 8B is a diagram illustrating a change in asymmetry of a nanowire without change to its cross-sectional area according to an embodiment of the present invention;

FIG. 9A is a graph illustrating the impact on a thinned core of errors on various oxidation parameters according to an embodiment of the present invention;

FIG. 9B is a graph illustrating an impact of pre-oxidation nanowire beam asymmetry on a thinned core according to an embodiment of the present invention;

FIGS. 12A-J are TEM images illustrating the performance of hydrogen annealing for symmetrization according to an embodiment of the present invention.

DETAILED DESCRIPTION OF PREFERRED EMBODIMENTS

Provided herein are improved techniques for fabricating nanowire-based devices. First described is a mask-less selective nanowire oxidation process. Pre-oxidation symmetrization techniques to improve control over final nanowire size and shape will be described in detail below.

Figure 1A:
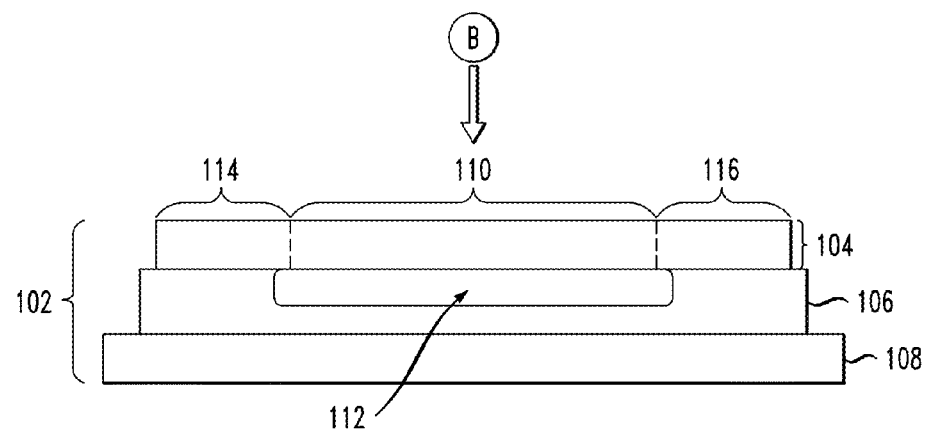
FIGS. 1A-F are diagrams illustrating an exemplary methodology for fabricating a nanowire-based semiconductor device that utilizes a mask-less nanowire thinning process according to an embodiment of the present invention.
Figure 1B:
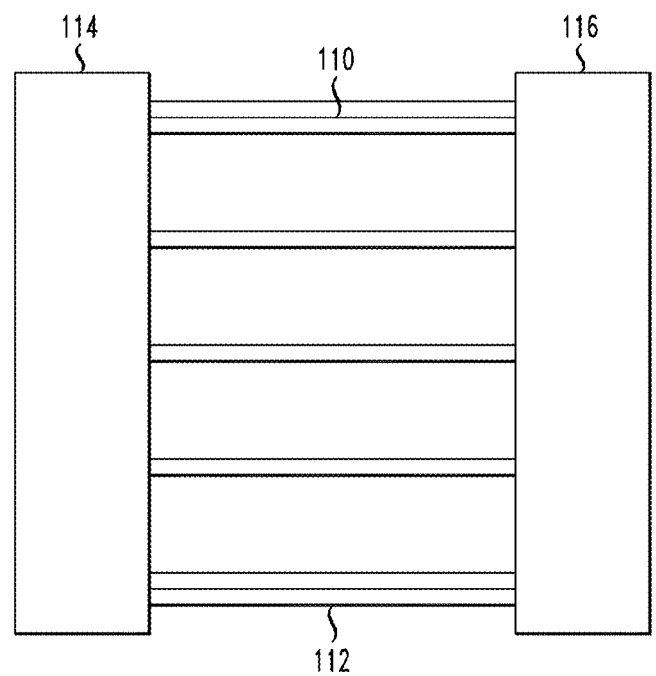

FIGS. 1A-F are diagrams illustrating an exemplary methodology for fabricating a nanowire-based semiconductor device that utilizes a mask-less selective nanowire thinning process. By eliminating a mask from the device fabrication process, the problems associated with selective masking at small dimensions are eliminated. As shown in FIG. 1A, a cross-sectional diagram, a wafer 102 is provided having silicon-on-insulator (SOI) layer 104 over buried oxide (BOX) layer 106 and substrate 108 (e.g., a silicon handle substrate) adjacent to a side of BOX layer 106 opposite SOI layer 104. Nanowires 110 and pads 114/116 are formed in SOI layer 104 using conventional lithography and etching processes. Such processes are known to those of skill in the art and thus are not described further herein. BOX layer 106 is then isotropically etched, using for example hydrofluoric acid in liquid or vapor form, to fully undercut BOX layer 106 beneath the nanowires (see undercut portion 112 of BOX layer 106). Undercut portion 112 partially releases nanowires 110 from BOX layer 106. A top-down view (from vantage point B) of nanowires 110 formed in SOI layer 104 is shown in FIG. 1B.

As shown in FIG. 1B, nanowires 110 and pads 114/116 etched into SOI layer 104 form a ladder-like structure having pads 114 and 116 attached at opposite ends of nanowires 110. Nanowires 110 span undercut portion 112 (see FIG. 1A), much like beams. While FIG. 1B depicts nanowires 110 as having a uniform shape, in practice a certain amount of variation from one nanowire to another is likely to occur. This variation is addressed below, and can be "corrected for" using a symmetrization procedure, which may be combined with the mask-less selective thinning process or alternatively with a self-limiting oxidative thinning process. The self-limiting oxidation process requires masking of the pads at oxidation (complicating the fabrication process) but provides for better control on the final nanowire dimensions.

Figure 1C:
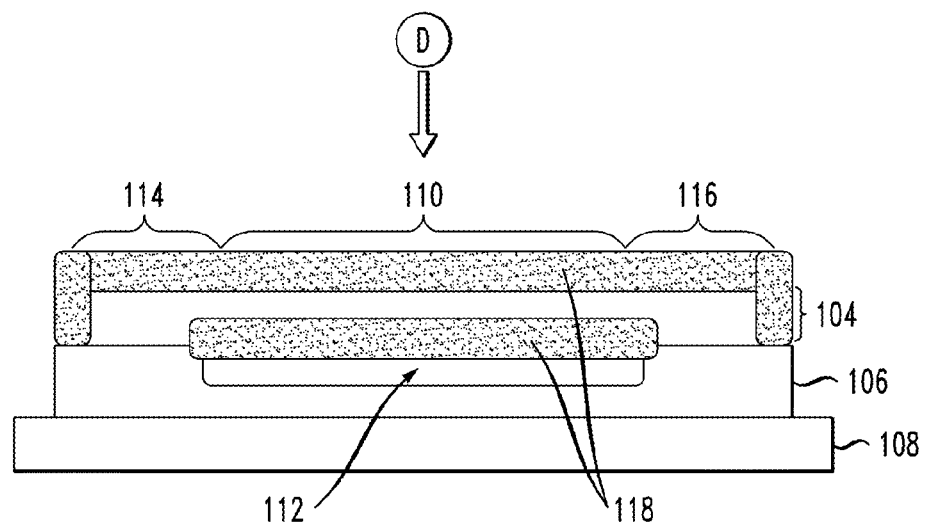

As shown in FIG. 1C, a cross-sectional diagram, nanowires 110 and pads 114/116 are oxidized, forming thermal oxide 118 (e.g., silicon dioxide). This oxidation "consumes" some of the silicon from the nanowires and pads by transforming the silicon into silicon dioxide (also referred to herein as a thermal oxide). Advantageously, with the present mask-less thinning techniques, process parameters are chosen such that the silicon consumption rate by oxidation on the nanowires is substantially the same as, or faster than, on the pads thus eliminating the need for a hardmask structure. The silicon dioxide can then be removed and the remaining silicon left standing.

By contrast, with the low temperature oxidation conditions used in other thinning techniques, oxidation on planar structures such as the pads is faster than on the nanowires (e.g., five times faster for self-limiting oxidation at 800 degrees Celsius (° C.)). Thus, in that case, a mask would be needed to protect the pads from oxidation.

The instant teachings present a way to inverse this geometrical effect by employing very high oxidation temperatures. For example, by employing these very high oxidation temperatures the consumption of silicon can be about 18 percent (%) faster on a nanowire than on a planar base (i.e., pads) at 1200° C. According to an exemplary embodiment, oxidation is carried out in the presence of an oxidizing gas to oxidize the silicon in the nanowires and pads under conditions, i.e., at a temperature, pressure and for a duration, that produce a ratio of a silicon consumption rate by oxidation on the nanowires to a silicon consumption rate by oxidation on the pads of from about 0.75 to about 1.25. For example, the rate of silicon consumption on the nanowires can be substantially the same as on the pads, i.e., the ratio of the silicon consumption rate by oxidation on the nanowires to the silicon consumption rate by oxidation on the pads is from about 0.75 to about one, or faster than on the pads, i.e., the ratio of the silicon consumption rate by oxidation on the nanowires to the silicon consumption rate by oxidation on the pads is from about one to about 1.25. For example, rapid thermal oxidation (also referred to herein as rapid thermal processing or RTP) at a temperature of greater than about 1100° C., e.g., from about 1100° C. to about 1400° C. for however long it takes to oxidize a desired amount of material (for example, for a duration of up to about 24 hours, e.g., from about 10 seconds to about 60 minutes) may be used to achieve on the nanowires an equivalent or faster silicon consumption than on the pads. The amount of material to be oxidized is dependent on a starting size and final desired size of the nanowires. By way of example only, if the starting diameter of each nanowire is 25 nanometers (nm) and the final desired diameter of each nanowire is 10 nm, then the removal of 7.5 nm of silicon by oxidation would be desirable. Rapid thermal oxidation for such short durations requires RTP in an oxidizing environment (such as pure oxygen, nitrous oxide or water vapor) at a pressure of from about one millitorr (mTorr) to about 100 atmospheres (atm). A top-down view (from vantage point D) of oxidized nanowires 110 and pads 114/116 is shown in FIG. 1D.

Figure 1D:
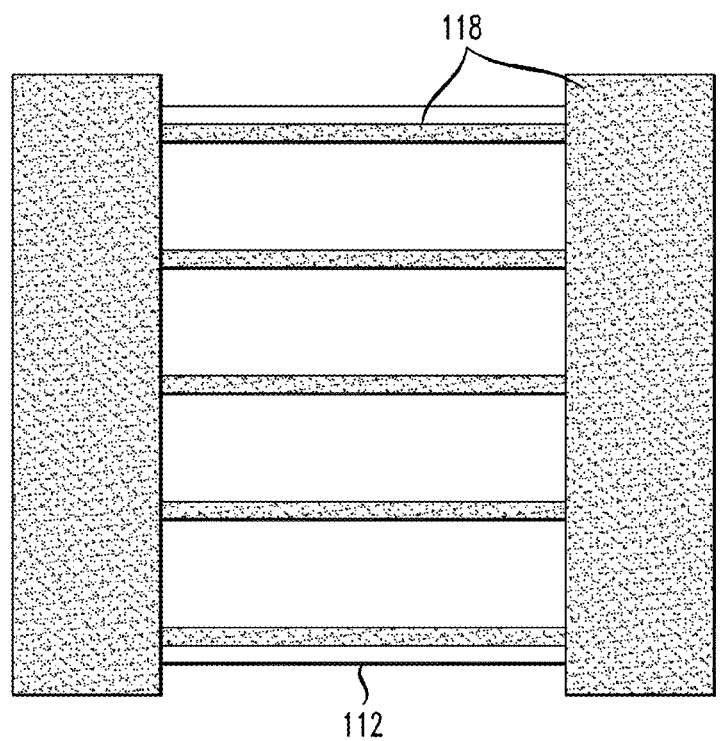

As shown in FIG. 1D, thermal oxide 118 has been formed on nanowires 110 and pads 114/116. It is notable from FIGS. 1C and 1D that the oxide grows on all sides of the nanowires.

Figure 1E:
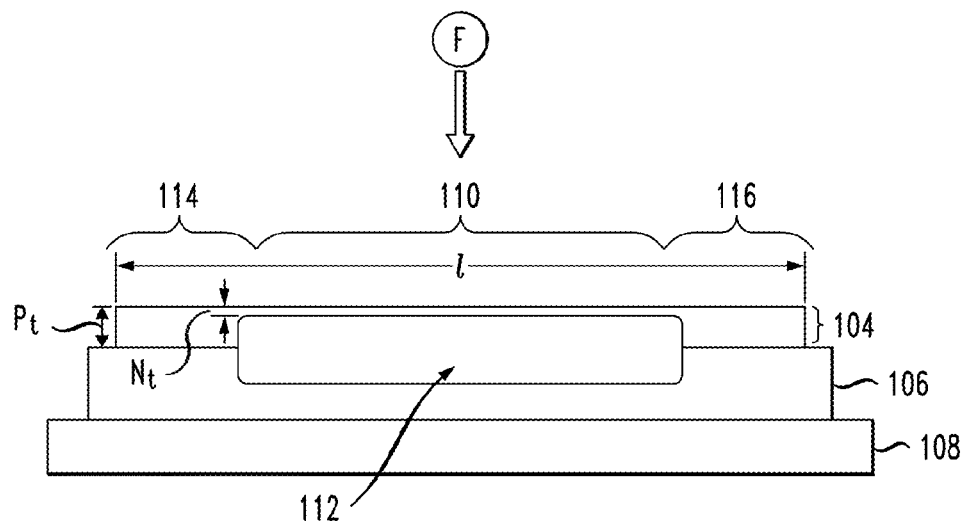
Figure 1F:
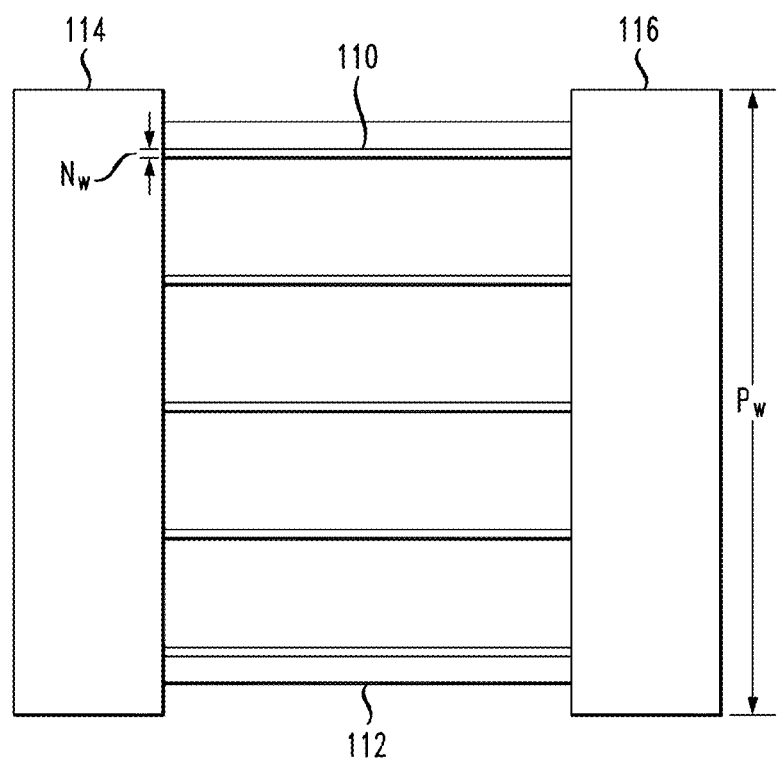

As shown in FIG. 1E, a cross-sectional diagram, thermal oxide 118 has been removed from nanowires 110 and pads 114/116. According to an exemplary embodiment, thermal oxide 118 is removed from the nanowires and pads using, e.g., hydrofluoric acid in liquid or vapor form. A comparison of FIG. 1E with FIG. 1A (described above) reveals that the thicknesses of the nanowires $N_t$ and pads $P_t$ have been thinned (reduced) by the oxidation process. A length l, from an outermost edge of one pad to an outermost edge of the other pad, has also been thinned (reduced) by the oxidation process. The above-described rapid thermal oxidation parameters are used to attain substantially the same silicon consumption on the nanowires and pads or faster silicon consumption on the nanowires than on the pads (see above). The thinning of the nanowires as compared to the pads is further amplified by the fact that oxide can grow on all sides of the nanowires, while the oxidation on the bottom of the pads is negligible due to the protection by the BOX layer 106. A top-down view (from vantage point F) of thinned nanowires 110 and pads 114/116 is shown in FIG. 1F. As shown in FIG. 1F, the widths of the nanowires $N_w$ and pads $P_w$ have also been thinned (reduced) by the oxidation process.

FIG. 2 is a graph 200 illustrating a calculated geometrical effect at rapid thermal oxidation using a computer simulation. In graph 200, process time, i.e., duration, (measured in minutes (min)) is plotted on the x-axis and silicon consumed (measured in nm) is plotted on the y-axis. The rate of silicon consumption at three different temperatures, i.e., 1150° C., 1175° C. and 1200° C., for both planar surfaces, such as the pads, and the nanowire are shown. These temperatures were chosen to be above 1100° C. where the oxide viscosity is sufficiently low to release the stress buildup due to the oxidation. As graph 200 illustrates, the consumption of silicon can be 18% faster on a nanowire than on the pads at 1200° C.

Figure 3:
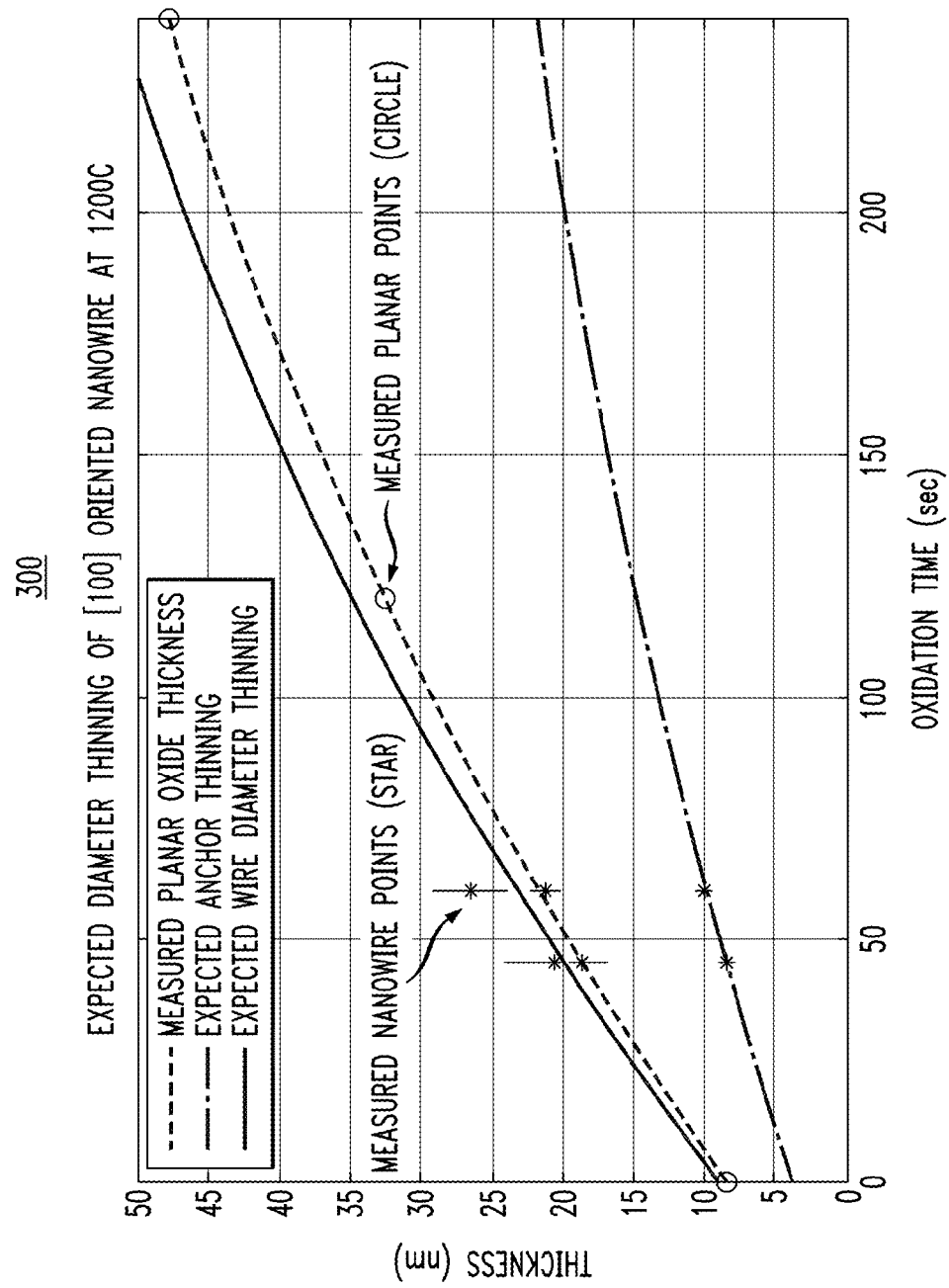
FIG. 3 is a graph of experimental data illustrating that silicon consumption is faster on nanowires than on pads according to an embodiment of the present invention.

FIG. 3 is a graph 300 of experimental data illustrating faster silicon consumption on nanowires than on pads. In graph 300, oxidation time (measured in seconds (sec)) is plotted on the x-axis and thickness (measured in nm) is plotted on the y-axis. The experimental data is overlapped with expected behavior from computer simulations. The data was collected at a processing temperature of 1200° C. in an oxygen ambient and at various oxidation times.

Figure 4:
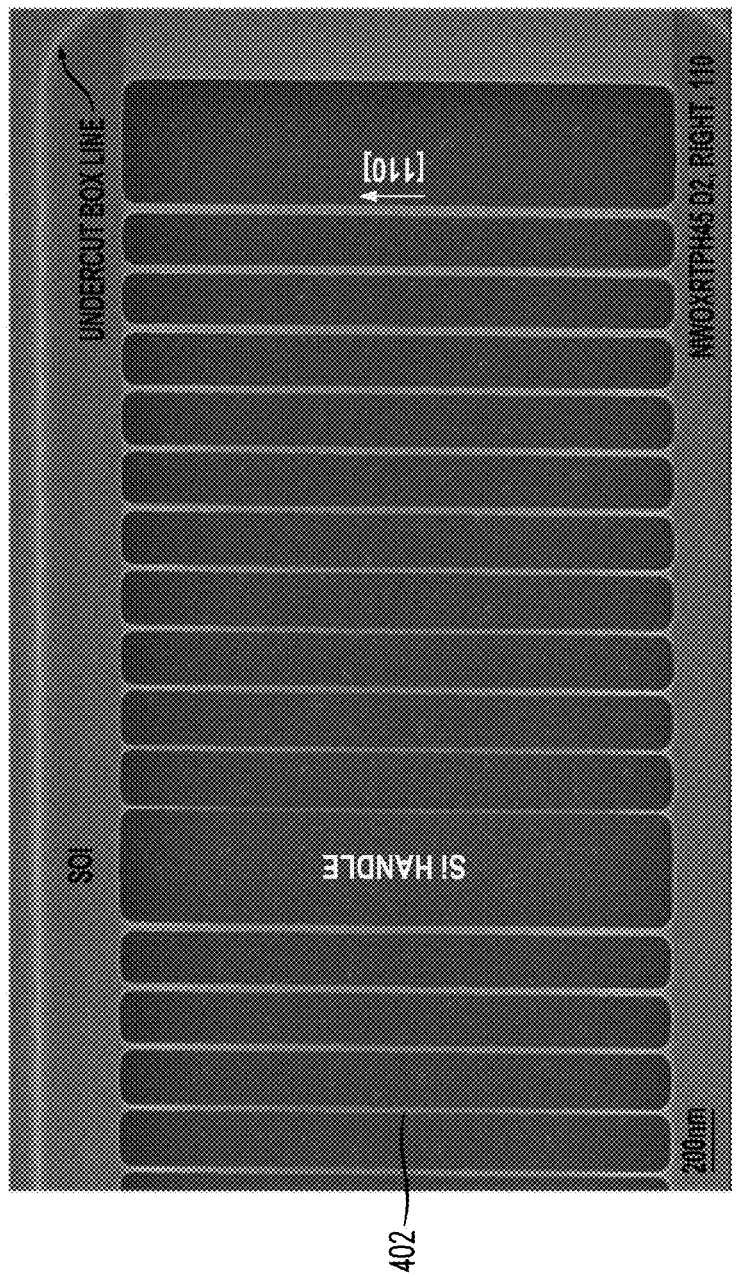
FIG. 4 is a top-down image of nanowires resulting from rapid thermal oxidation of 70 nanometers (nm) thick nanowire beams of varying widths according to an embodiment of the present invention.

FIG. 4 is a top-down image 400 of nanowires 402 resulting from rapid thermal oxidation of 70 nm thick nanowire beams of varying widths according to the parameters set forth in the present teachings. As shown in image 400, each nanowire beam was thinned by about 30 nm with no observable non-uniformities or buckling (even on these beams which are about two micrometers (μm) in length). Where the SOI layer has been released from the BOX is labeled "undercut BOX line," and [110] is the crystallographic direction. The smallest wire attained had a thickness of about 40 nm and a width of about 16 nm.

Figure 5A:
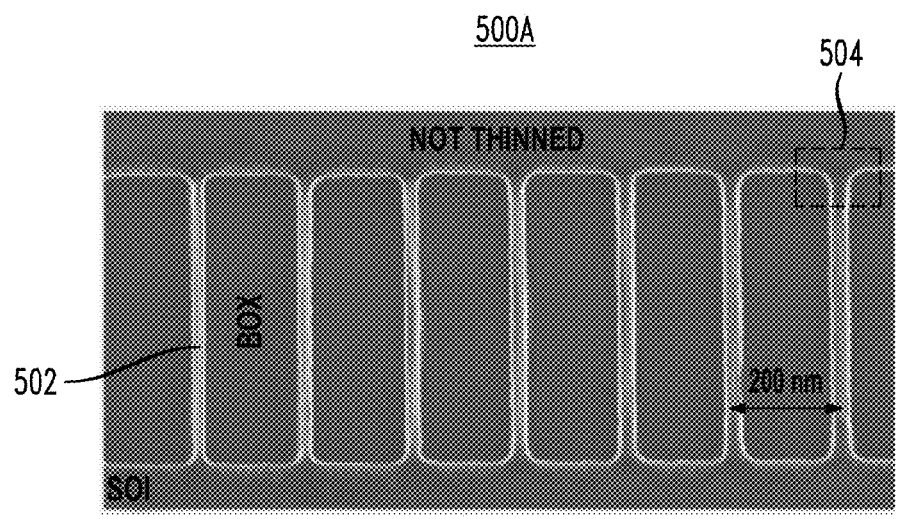
FIGS. 5A-D are top-down images of 30 nm thick nanowire beams of varying widths being thinned using rapid thermal oxidation according to an embodiment of the present invention.
Figure 5B:
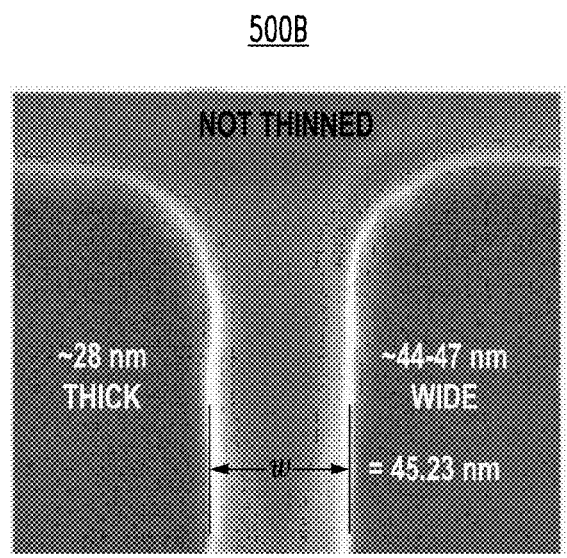

FIGS. 5A-D are top-down images 500A-D, respectively, of 30 nm thick nanowire beams of varying widths being thinned using rapid thermal oxidation according to the parameters set forth in the present teachings. Specifically, image 500A in FIG. 5A shows the nanowire beams 502 before thinning. Portion 504 of image 500A is shown enlarged in FIG. 5B. Image 500B in FIG. 5B highlights the nanowire beam in the series having the greatest width, i.e., a width w of from about 44 nm to about 47 nm.

Figure 5C:
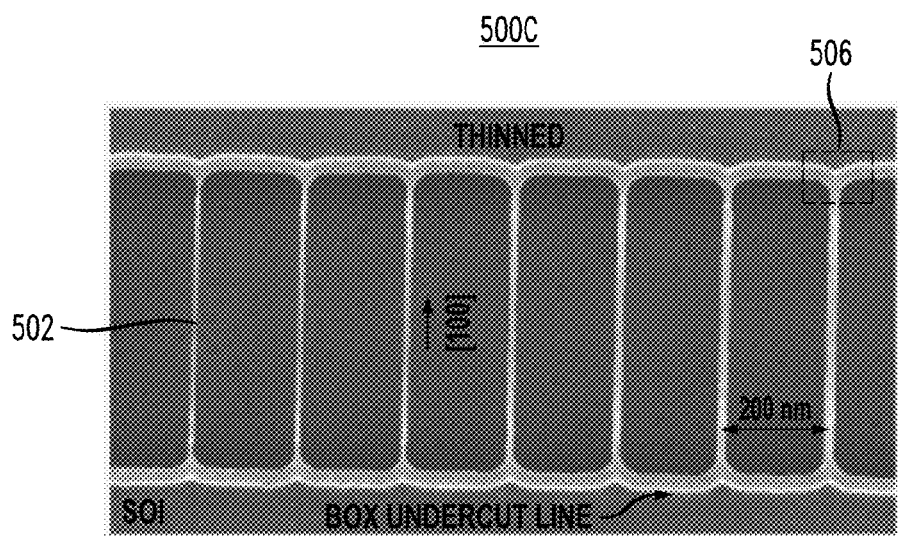
Figure 5D:
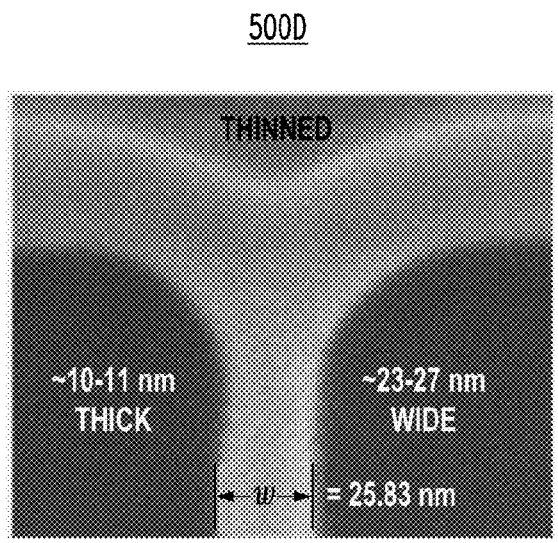

Image 500C in FIG. 5C shows the nanowire beams 502 after thinning. In image 500C, [100] is the crystallographic direction (i.e., image 400 of FIG. 4 and image 500C illustrate two experiments done on two different directions). Portion 506 of image 500C is shown enlarged in FIG. 5D. Image 500D in FIG. 5D again highlights the nanowire beam in the series having the greatest width, which has been thinned to a width w of from about 23 nm to about 27 nm. The thickness of the nanowire beam has also been reduced from, i.e., about 28 nm to from about 10 nm to about 11 nm.

As highlighted above, a pre-oxidation symmetrization may be used to control the final nanowire shape and size (which are important device parameters to be able to control). By way of example only, this pre-oxidation symmetrization may be carried out prior to the rapid thermal oxidation-based thinning steps described above. An advantage to this exemplary implementation is that it takes advantage of a mask-less thinning process. However, the symmetrization may be followed by a rate-limiting oxidation step to thin the nanowires. In most instances, this would however require masking but would offer better control on the nanowire size. See below.

Figure 6A:
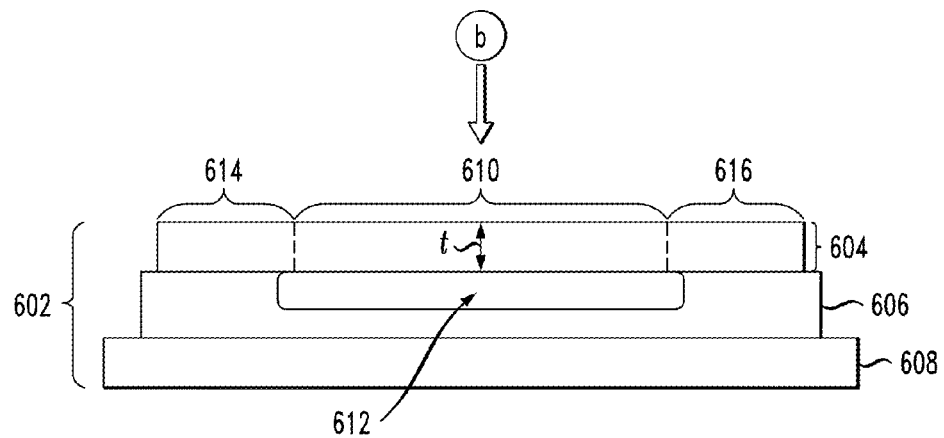
FIGS. 6A-F are diagrams illustrating an exemplary methodology for fabricating a nanowire-based semiconductor device that utilizes pre-oxidation symmetrization to control final nanowire size and shape according to an embodiment of the present invention.
Figure 6B:
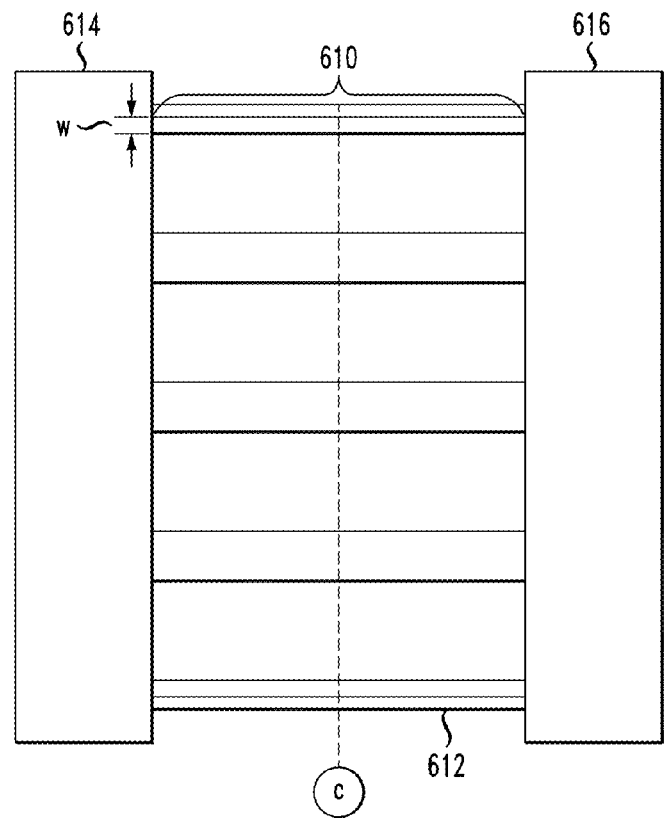

FIGS. 6A-F are diagrams illustrating an exemplary methodology for fabricating a nanowire-based semiconductor device that utilizes pre-oxidation symmetrization for improved control on final nanowire size and shape. As shown in FIG. 6A, a cross-sectional view, a wafer 602 is provided having SOI layer 604 over BOX layer 606 and substrate 608 (e.g., a silicon handle substrate) adjacent to a side of BOX layer 606 opposite SOI layer 604. Nanowires 610 and pads 614/616 are formed in SOI layer 604 using conventional lithography and etching processes. Such processes are known to those of skill in the art and thus are not described further herein. BOX layer 606 is then isotropically etched, using for example hydrofluoric acid in liquid or vapor form, to fully undercut BOX layer 606 beneath the nanowires (see undercut portion 612 of BOX layer 606). A top-down view (from vantage point b) of nanowires 610 formed in SOI layer 604 is shown in FIG. 6B.

As shown in FIG. 6B, nanowires 610 and pads 614/616 etched into SOI layer 604 form a ladder-like structure having pads 614 and 616 attached at opposite ends of nanowires 610. Nanowires 610 span undercut portion 612 of BOX layer 606 (see FIG. 6A), much like beams.

Even with the most precise lithography and etching processes available, a width w and/or thickness t (see FIG. 6A) of a given nanowire will likely vary from other nanowires in the assembly. Variations in this aspect ratio of width to thickness from one nanowire to another, if not corrected, can result in nanowires in the final structure having different dimensions. Such variation can adversely affect device performance. Advantageously, with the present teachings it has been found that by first symmetrizing the nanowires (setting all of the nanowires to a uniform aspect ratio) prior to thinning can result in substantially uniform final nanowire dimensions. This symmetrization process and subsequent thinning steps are now described by way of reference to various cross-sectional views through plane c.

Figure 6C:
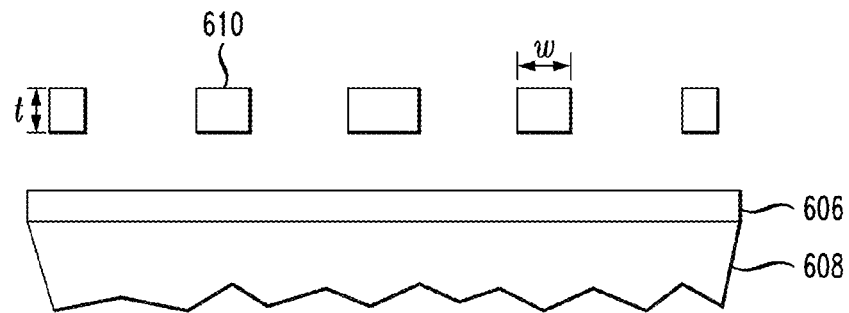
Figure 6D:
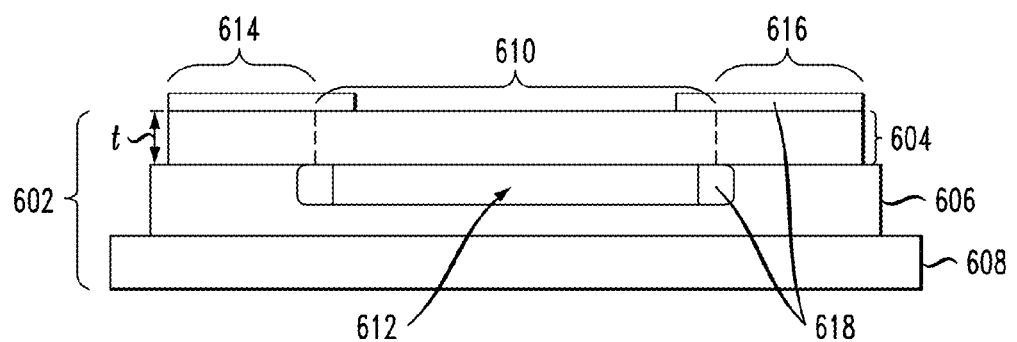

As shown in FIG. 6C, after lithography and etching, nanowires 610 have varying aspect ratios. For ease of depiction, only differences in the width w are shown, however, variations in both the width w and the thickness t are possible. To unify the aspect ratios (of width to thickness) of the nanowires, an annealing process is used to reflow the nanowire silicon. However, it is preferable to first mask the pads to prohibit the thermodynamically favored reflow of silicon from the nanowires towards the pads (i.e., rather than the desired reflow of silicon along a circumference of the nanowires). Referring again briefly to a cross-sectional view, in FIG. 6D a mask 618 is shown formed over pads 614 and 616, and within well 612 so as to protect pads 614 and 616 from all sides during the annealing. According to an exemplary embodiment, mask 618 comprises a nitride material and is formed for example using low-pressure chemical vapor deposition. The mask 618 can also be used at the following thinning step. If self-limiting oxidation thinning is used, the mask can reduce the rate of silicon consumption by oxidation on the pads to below the rate of silicon consumption by oxidation on the nanowires. Without a mask, the rate of silicon consumption by oxidation on the pads can be as much as five times faster than on the nanowires for self-limiting oxidation. In this example, the mask 618 can in general comprise any material that will reduce the rate of silicon consumption by oxidation on the pads to be below the rate of silicon consumption by oxidation on the nanowires.

Figure 6E:
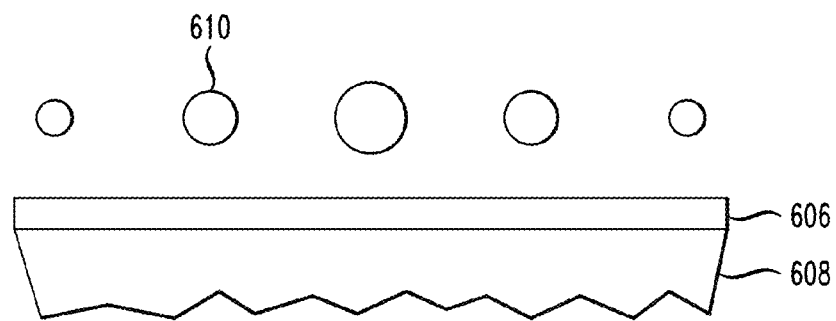

Switching once again to views through plane c, as shown in FIG. 6E, the aspect ratios of nanowires 610 are symmetrized, i.e., made uniform. This step is carried out using hydrogen annealing, wherein the nanowires are contacted with hydrogen gas under conditions (see, e.g., temperature, pressure and duration processing conditions below) that produce a reflow of silicon along a circumference of the nanowires. By way of the reflow, the aspect ratio of width to thickness is unified among all of the nanowires. According to an exemplary embodiment, the nanowires are heated to a temperature of from about 500° C. to about 1300° C., e.g., from about 750° C. to about 950° C., in the presence of hydrogen gas (at a pressure of from about $1\times10^{-9}$ Torr to about $1\times10^{3}$ Torr, e.g., about $1\times10^{-2}$ Torr) for a duration of from about one second to about one day (24 hours), e.g., from about one second to about 10 hours. A similar symmetrization result can be obtained with long low-temperature anneals and short high-temperature anneals. The choice of process conditions will depend on the desired throughput and the tolerable process temperature for a given structure.

The hydrogen annealing enables surface diffusion of silicon resulting in reflow of the nanowire silicon causing nanowires 610 to take on a more cylindrical shape, thereby changing the aspect ratio. As a result, each of nanowires 610 will have a substantially uniform aspect ratio (e.g., an aspect ratio of about one, with a perfect cylinder having a width to thickness aspect ratio of one). Namely, the required uniformity of the aspect ratio depends, at least in part, on the oxidation conditions used after symmetrization. However, even if the aspect ratio does not equal one and the nanowire is slightly asymmetric it is preferable that the aspect ratio does not differ from one by more than about 15%.

Once the nanowires have been symmetrized using the hydrogen anneal, an oxidation process is then used to thin the nanowires. According to one exemplary embodiment, the mask-less rapid thermal oxidation steps described, for example, in conjunction with the description of FIGS. 1A-F are employed. Other oxidation procedures are however also possible, and according to another exemplary embodiment, a low-temperature oxidation process is performed to thin the nanowires as will now be described. The low-temperature process is referred to as self-limiting oxidation. When compared to rapid thermal oxidation, self-limiting oxidation improves control on nanowire size but requires masking of the pads.

In one exemplary implementation of the low-temperature oxidation process, oxidation of the nanowires is carried out at a temperature of from about 600° C. to about 1150° C., preferably from about 600° C. to about 950° C., in the presence of an oxidizing gas, such as oxygen, water vapor or nitrous oxide, at a pressure of from about one mTorr to about 100 atm, for example, from about 0.1 atm to about 30 atm, e.g., about one atm, for a duration of from about one second to about one week, for example, from about one minute to about one week. Low-temperature oxidation of cylindrical silicon structures results in a self-limiting effect (oxidation slows down sharply as radius decreases). This effect can be very useful for accurate thinning of silicon beams into silicon nanowires. The lower the temperature of oxidation, the stronger the self-limitation due to higher stress-levels being attained in the growing oxide. However, the lower the oxidation temperature, the longer the oxidation for a given amount of thinning. The choice of temperature and oxidation time will be given by the desired throughput, the desired level of self-limitation and the desired amount of thinning.

Figure 6F:
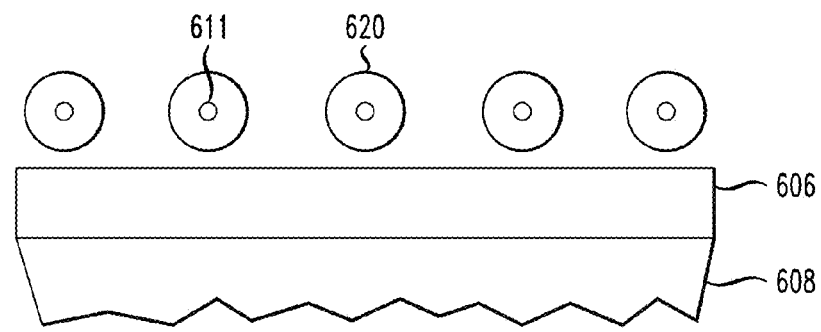
Figure 7A:
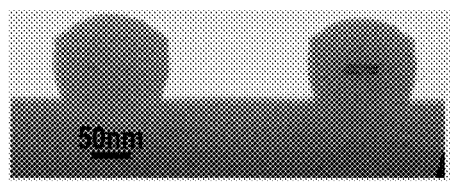
FIGS. 7A-E are transmission electron microscopy (TEM) images illustrating a sensitivity of self-limiting oxidation to an initial nanowire aspect ratio according to an embodiment of the present invention.
Figure 7B:
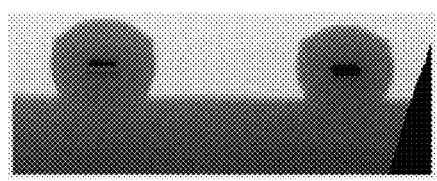
Figure 7C:
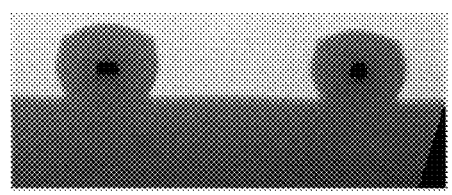
Figure 7D:
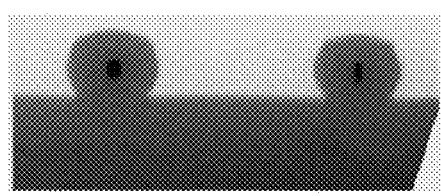
Figure 7E:
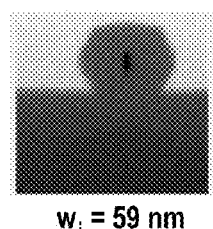

Namely, as shown in FIG. 6F, the result of the pre-oxidation symmetrization combined with low-temperature oxidation is nanowire cores 611 all having about the same shape and dimensions (e.g., diameter) as one another. Thermal oxide 620 (silicon dioxide) that has formed on nanowire cores 611 can be subsequently removed, for example, by hydrofluoric acid in liquid or vapor form.

FIGS. 7A-E are transmission electron microscopy (TEM) images illustrating a sensitivity of self-limiting oxidation to an initial nanowire aspect ratio. These images illustrate the need to symmetrize the nanowires prior to oxidation so as to avoid the results shown, and as such provide motivation for the present symmetrization techniques. The pre-oxidation nanowire beams were all 66 nm thick. The pre-oxidation widths of the beams, labeled $w_i$ on each of the images, ranged from 59 nm to 106 nm. As the images show, the wider beams resulted in flat almost nonexistent double-cores, while the narrower beams resulted in thicker cores. What is interesting is that the beams with the largest initial widths result in cores with the smallest cross-sectional area. The cores with the largest cross-sectional area resulted from beams with starting aspect ratios close to one. This is due to a reduction in the rate of the oxidation due to a higher stress concentration in beams with starting aspect ratios close to one. The greater the stress, the stronger the reduction of the oxidation rate with the shrinking core size and the better the control on nanowire size is.

As highlighted in the present teachings, pre-oxidation nanowire beam asymmetry has a major impact on the thinned core. This impact is illustrated via computational results shown in FIGS. 9A and 9B and in FIGS. 10A and 10B (described below). FIG. 8A shows a cross-sectional area change of a nanowire without change in its asymmetry while FIG. 8B shows a change in the asymmetry of a nanowire without change to its cross-sectional area. FIG. 8B defines the asymmetry (a) of a nanowire.

FIG. 9A is a graph illustrating the impact on a thinned core of errors on various oxidation parameters. In the graph in FIG. 9A, the sensitivity of the effective core diameter $d_f$ (measured in nm) (defined as $d_f=2*(A_f/pi)^{(1/2)}$ where $A_f$ is final cross-sectional area) on parameter errors such as initial beam asymmetry (a), a temperature of the oxidation process (T) (measured in degrees Kelvin (K)), length of time of the oxidation process (t) (measured in minutes), crystallographic orientation of the nanowires ($\theta$) (measured in degrees) and pre-oxidation effective diameter (defined as $d_i=2*(A_i/pi)^{(1/2)}$, where $A_i$ is initial cross-sectional area) is expressed through partial derivatives computed by finite element simulations. The higher the partial derivative, the stronger the sensitivity. In the graph in FIG. 9B, the impact of pre-oxidation nanowire beam asymmetry on the thinned core size is again illustrated through partial derivatives computed by finite element simulations. In both FIGS. 9A and 9B, side of pre-oxidation square beam (measured in nm) is plotted on the x-axis and absolute value of the partial derivative is plotted on the y-axis. Comparing FIG. 9A to FIG. 9B, it can be seen that the asymmetry partial derivatives in FIG. 9B are larger than the partial derivatives of the other parameters shown in FIG. 9A. Hence, asymmetry has the strongest impact on the effective final diameter from all the parameters studied. The simulations were done for an 800° C. steam oxidation for various starting beam sizes.

Figure 10A:
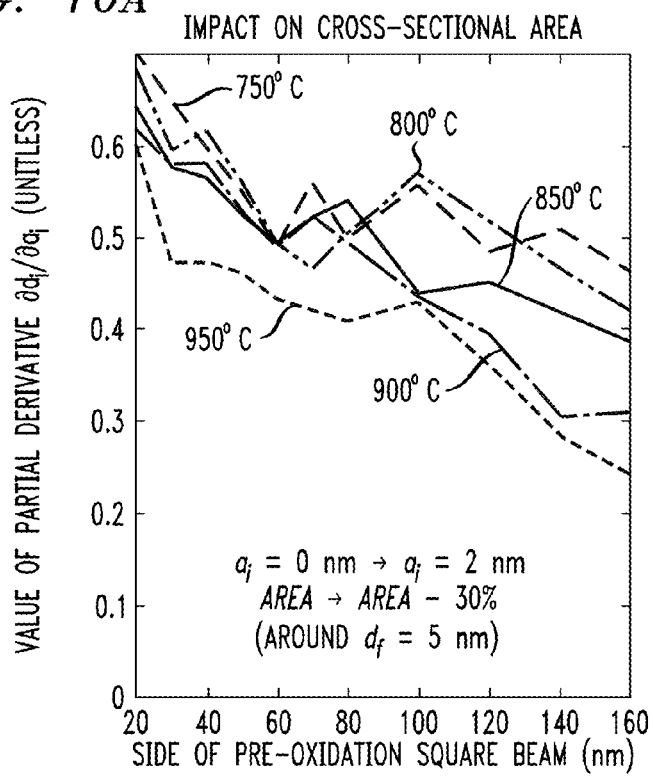
FIG. 10A is a graph illustrating a sensitivity to asymmetry for various oxidation temperatures and pre-oxidation nanowire dimensions according to an embodiment of the present invention.
Figure 10B:
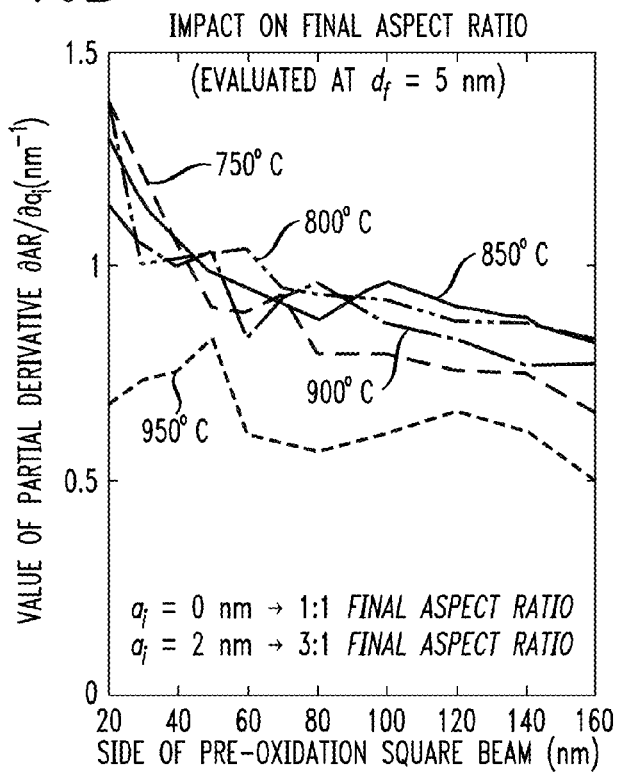
FIG. 10B is a graph illustrating that the impact of asymmetry is even higher on an aspect ratio of a thinned core than on its effective diameter according to an embodiment of the present invention.

FIG. 10A is a graph illustrating a sensitivity to asymmetry for various oxidation temperatures and pre-oxidation nanowire dimensions. Side of pre-oxidation square beam (measured in nm) is plotted on the x-axis and value of partial derivative $$\frac{\partial d_f}{\partial a_i}$$

is plotted on the y-axis. FIG. 10A illustrates that the sensitivity remains high for all temperatures and dimensions studied, which reinforces the need for a pre-oxidation symmetrization procedure as is described in the present teachings. FIG. 10B is a graph illustrating that the impact of asymmetry is even higher on an aspect ratio of a thinned core than on its effective diameter. Side of pre-oxidation square beam (measured in nm) is plotted on the x-axis and value of partial derivative $$\frac{\partial AR}{\partial a_i}$$

(measured in $nm^{-1}$ with AR being the final cross-sectional aspect ratio of the nanowire) is plotted on the y-axis.

Figure 11A:
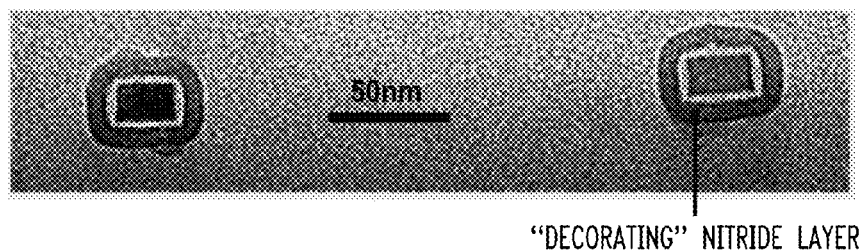
FIGS. 11A-C are TEM images of asymmetric starting nanowire beams before symmetrization, the beams after symmetrization and the beams after self-limiting oxidation, respectively, according to an embodiment of the present invention.
Figure 11B:
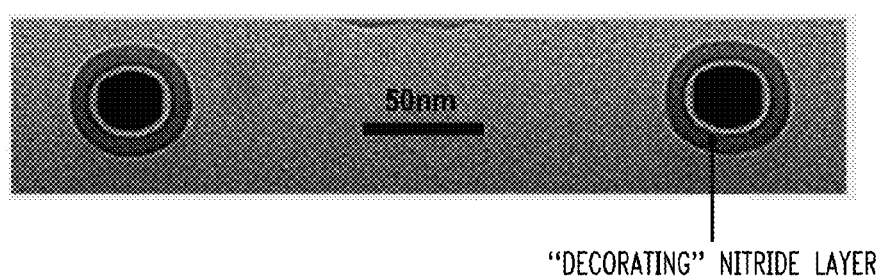
Figure 11C:
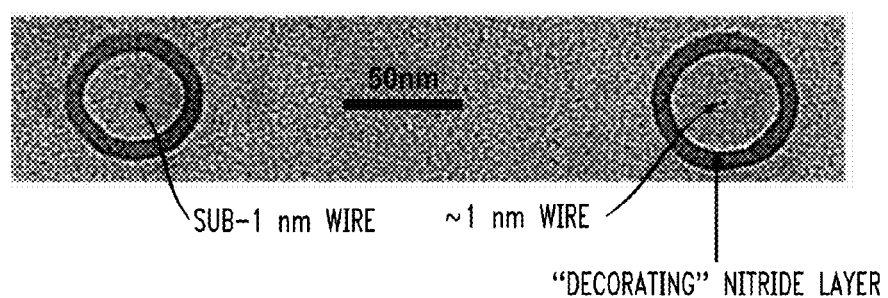

FIGS. 11A-C are TEM images of asymmetric (i.e., aspect ratio≠one) starting nanowire beams before symmetrization, the beams after symmetrization and the beams after self-limiting oxidation, respectively. A nitride layer is included on each structure merely to provide contrast for viewing the images. It can be seen from the images that in this extreme example, the symmetrization was not perfect on these highly asymmetric starting beams. However, the symmetrization was sufficient (an example of substantial symmetrization) as the resulting wire did not split even when thinned to diameters below one nm. Without symmetrization, the oxidation would have resulted in two wires per asymmetric beam.

FIGS. 12A-J are TEM images illustrating the performance of hydrogen annealing for symmetrization. The thickness of each pre-oxidation beam was 21 nm, while the widths varied from 10 nm to 42 nm. The rectangles in the top right hand corner of each image illustrate the pre-symmetrization shape of each beam. Expected lithographic errors in a production of computer chips would only require two consecutive beams in this set to be well symmetrized. Here, all beams are substantially symmetrized showing the high performance of the symmetrization process of the present teachings. A 20 nm legend is shown in each image.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method for fabricating a semiconductor device, comprising the steps of:
   providing a wafer having a SOI layer over a BOX layer;
   etching nanowires and pads into the SOI layer to form a ladder-like structure wherein the pads are attached at opposite ends of the nanowires;
   undercutting the BOX layer beneath the nanowires and a portion of the pads;
   forming a mask present only i) on a top of the pads and ii) in regions beneath a portion of the nanowires and the portion of the pads that are exposed by undercutting the BOX layer;
   unifying an aspect ratio of width to thickness among all of the nanowires, wherein the mask is configured to prohibit reflow of silicon from the nanowires towards the pads during the unifying step; and
   thinning the nanowires by oxidation of the silicon in the nanowires,
   wherein the steps of the method are carried out in the order presented.

2. The method of claim 1, wherein the step of unifying the aspect ratio among all of the nanowires further comprises the step of:
   contacting the nanowires with hydrogen gas under conditions that produce a reflow of silicon along a circumference of the nanowires, and by way of the reflow unify the aspect ratio of width to thickness among all of the nanowires.

3. The method of claim 2, wherein the nanowires are contacted with hydrogen gas at a temperature of from about 500° C. to about 1300° C.

4. The method of claim 2, wherein the nanowires are contacted with hydrogen gas at a pressure of from about $1 \times 10^{-9}$ Torr to about $1 \times 10^3$ Torr.

5. The method of claim 2, wherein the nanowires are contacted with hydrogen gas for a duration of from about one second to about ten hours.

6. The method of claim 1, wherein the step of thinning the nanowires further comprises the steps of
   contacting the nanowires with an oxidizing gas at a temperature, pressure and for a duration at which self-limiting oxidation of the nanowires occurs.

7. The method of claim 6, wherein the oxidizing gas comprises oxygen, water vapor or nitrous oxide.

8. The method of claim 6, wherein the nanowires are contacted with the oxidizing gas at a temperature of from about 600° C. to about 950° C.

9. The method of claim 6, wherein the nanowires are contacted with the oxidizing gas at a pressure of from about 0.1 atm to about 30 atm.

10. The method of claim 6, wherein the nanowires are contacted with the oxidizing gas for a duration of from about one minute to about one week.

11. The method of claim 6, further comprising the step of:
    removing thermal oxide that has formed on the nanowires during the thinning step.

12. The method of claim 6, further comprising the step of:
    masking the pads before oxidation with a material that will reduce the rate of silicon consumption by oxidation on the pads to be below the rate of silicon consumption by oxidation on the nanowires.

* * * * *